(12) United States Patent
Khorrami et al.

(10) Patent No.: US 9,968,004 B2
(45) Date of Patent: May 8, 2018

(54) THERMAL INTERFACE MATERIALS INCLUDING ELECTRICALLY-CONDUCTIVE MATERIAL

(71) Applicant: LAIRD TECHNOLOGIES, INC., Earth City, MO (US)

(72) Inventors: Mohammadali Khorrami, Foxboro, MA (US); Paul Francis Dixon, Sharon, MA (US)

(73) Assignee: Laird Technologies, Inc., Earth City, MO (US)

( * ) Notice: Subject to any disclaimer, the term of this patent is extended or adjusted under 35 U.S.C. 154(b) by 0 days. days.

(21) Appl. No.: 15/271,635

(22) Filed: Sep. 21, 2016

(65) Prior Publication Data

US 2017/0094831 A1 Mar. 30, 2017

Related U.S. Application Data

(60) Provisional application No. 62/233,040, filed on Sep. 25, 2015, provisional application No. 62/242,592, filed on Oct. 16, 2015.

(51) Int. Cl.
*H05K 7/20* (2006.01)
*H05K 1/02* (2006.01)
(Continued)

(52) U.S. Cl.
CPC .......... *H05K 7/2039* (2013.01); *H01L 23/34* (2013.01); *H01P 1/201* (2013.01); *H01P 3/12* (2013.01);
(Continued)

(58) Field of Classification Search
CPC .. G02B 6/4403; G02B 6/4433; G02B 6/4494; G02B 6/0365; G02B 6/4483;
(Continued)

(56) References Cited

U.S. PATENT DOCUMENTS 5,060,114 A * 10/1991 Feinberg ............... H01L 23/433
165/185
6,449,156 B1 * 9/2002 Han ......................... G11C 5/04
165/80.3
(Continued)

*Primary Examiner* — Adam B Dravininkas
(74) *Attorney, Agent, or Firm* — Harness, Dickey & Pierce, P.L.C.

(57) ABSTRACT

According to various aspects, exemplary embodiments are disclosed of thermal interface materials including electrically-conductive material, shields including thermal interface materials, and related methods. In an exemplary embodiment, a thermal interface material generally includes a top surface, a bottom surface, and one or more outer side surfaces extending between the top and bottom surfaces. Electrically-conductive material is along and/or adjacent the one or more outer side surfaces. The thermal interface material may be configured to be operable as a waveguide through which energy below a cutoff frequency cannot flow. The electrically-conductive material may be parallel with a direction of heat flow from a heat source to a heat removal/dissipation structure when the bottom surface is positioned against or adjacent the heat source and the top surface is positioned adjacent or against the heat removal/dissipation structure.

20 Claims, 3 Drawing Sheets

(51) Int. Cl.
*H01P 1/201* (2006.01)
*H05K 9/00* (2006.01)
*H01L 23/34* (2006.01)
*H01P 3/12* (2006.01)

(52) U.S. Cl.
CPC ......... *H05K 1/0203* (2013.01); *H05K 1/0216* (2013.01); *H05K 9/0032* (2013.01); *H05K 9/0081* (2013.01)

(58) Field of Classification Search
CPC .. G02B 6/02357; G02B 6/4404; G02B 6/443; G02B 6/4401; H05K 9/0062; H05K 7/1495; H05K 1/0222; H05K 7/2039; H05K 9/0032; H05K 1/0216; H05K 1/0203; H05K 9/0081; H01L 23/34; H01P 1/201
See application file for complete search history.

(56) References Cited

U.S. PATENT DOCUMENTS

| | | | |
|---|---|---|---|
| 6,596,937 B2 | 7/2003 | Mazurkiewicz | |
| 7,129,422 B2 | 10/2006 | Arnold | |
| 7,262,369 B1* | 8/2007 | English | H01L 23/04 174/370 |
| 7,463,496 B2* | 12/2008 | Robinson | H01L 23/552 361/816 |
| 8,477,499 B2 | 7/2013 | Hill et al. | |
| 8,704,341 B2 | 4/2014 | Lin et al. | |
| 8,824,142 B2 | 9/2014 | Jewell-Larsen et al. | |
| 8,847,184 B2 | 9/2014 | Cheng et al. | |
| 9,040,159 B2 | 5/2015 | Li et al. | |
| 9,111,915 B1 | 8/2015 | Sundstrom | |
| 9,111,954 B2 | 8/2015 | Chen et al. | |
| 2002/0130739 A1 | 9/2002 | Cotton | |
| 2003/0193794 A1* | 10/2003 | Reis | H01L 23/552 361/816 |
| 2008/0106884 A1* | 5/2008 | English | H05K 9/0032 361/818 |
| 2010/0309631 A1* | 12/2010 | Hill | H04M 1/0277 361/705 |
| 2011/0117338 A1 | 5/2011 | Poquette et al. | |
| 2013/0077282 A1* | 3/2013 | Malek | H05K 9/003 361/818 |
| 2014/0182924 A1* | 7/2014 | Misra | H05K 7/20454 174/377 |
| 2015/0043162 A1 | 2/2015 | Chen et al. | |
| 2015/0092351 A1 | 4/2015 | Chowdhury et al. | |
| 2015/0201533 A1* | 7/2015 | Daughtry, Jr. | H05K 9/0028 174/377 |
| 2015/0241936 A1* | 8/2015 | Hur | G06F 1/1656 361/679.54 |
| 2015/0282392 A1* | 10/2015 | Liu | H05K 9/0024 361/707 |

* cited by examiner

THERMAL INTERFACE MATERIALS INCLUDING ELECTRICALLY-CONDUCTIVE MATERIAL

CROSS-REFERENCE TO RELATED APPLICATIONS

This application claims the benefit of and priority to U.S. Provisional Application No. 62/233,040 filed Sep. 25, 2015 and U.S. Provisional Patent Application No. 62/242,592 filed Oct. 16, 2015. The entire disclosures of the above applications are incorporated herein by reference.

FIELD

The present disclosure generally relates to thermal interface materials including electrically-conductive material.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

FIG. 1 is a perspective view of a board level shield (BLS) mounted on a printed circuit board (PCB), wherein the top of the BLS includes an opening to allow heat to escape, but the opening also allows electromagnetic energy to escape from under the BLS;

FIG. 2 is a perspective view of the BLS shown in FIG. 1 after a thermal interface material (TIM) has been inserted into the opening in the top of the BLS, whereby the TIM (e.g., a thermal pad, etc.) may make direct contact with a heat source (e.g., chip, etc.) on the PCB underneath the BLS and also with a heat removal/dissipation structure or component (e.g., heat sink, etc.) above and outside the BLS;

Corresponding reference numbers indicate corresponding parts throughout the several views of the drawings.

DETAILED DESCRIPTION

Figure 1:
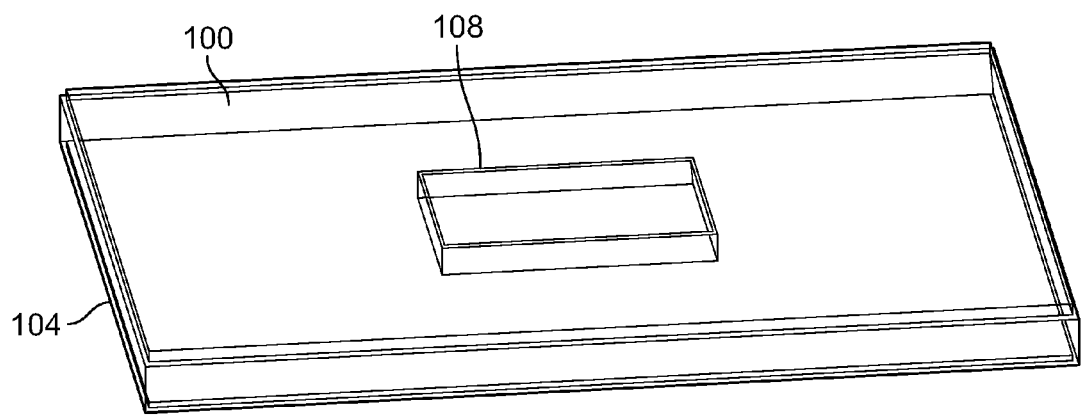

Example embodiments will now be described more fully with reference to the accompanying drawings.

Board level shields effectively prevent radiated electromagnetic emissions. But board level shields are not efficient thermal interface materials hence thermal issues can be an issue. To alleviate the thermal issues, holes may be made in a BLS to allow heat to escape. Thermal interface materials (TIMs) may also be used to conduct heat outside the BLS. But as recognized by the inventors hereof, the holes and the TIMs create an efficient conduit for electromagnetic interference (EMI) to escape from under the BLS.

The insertion of the TIM in the BLS opening increases the radiated electromagnetic emissions due to the TIM acting as a conduit or waveguide, which guides energy through the BLS opening to the outside. Replacing the TIM material with a thermally-conductive microwave absorber material did not solve the problem. The thermally-conductive microwave absorber material was ineffective in some situations because there is not sufficient absorber volume in a given thermal pad to provide sufficient attenuation.

After recognizing the above, the inventors hereof developed and disclose herein exemplary embodiments in which electrically-conductive material is added to a TIM (e.g., thermal pad, etc.) to help contain EMI that might otherwise be emitted or escape from under the BLS via the TIM. The inventors have found that enclosing or covering the outer surfaces of the TIM's sides or edges with electrically-conductive material forces the waveguide created by the TIM into a particular size with well-defined boundary conditions. This is defined as a "waveguide below cutoff", which is a phenomena where a waveguide of a particular size will not allow waves below a given frequency (the cutoff frequency) to propagate. In one example, enclosing or covering the outer surfaces of the TIM's sides provided twenty decibels (dB) of radiated emissions reduction.

The equation for cutoff frequency of a rectangular waveguide is set forth below.

$$(f_c)_{mn} = \frac{1}{2 \cdot \pi \cdot \sqrt{\mu \varepsilon}} \sqrt{\left(\frac{m \cdot \pi}{a}\right)^2 + \left(\frac{n \cdot \pi}{b}\right)^2} \; [\text{Hz}]$$

where $f_c$ is the cutoff frequency, a and b are the dimensions of the waveguide, $\mu$ is the magnetic permeability of the material inside, $\varepsilon$ is the electric permittivity of the material inside (TIM properties), and m and n are mode numbers. The lowest cutoff frequency is found when either m or n equals 1 and the other equals zero. For an air filled waveguide that is 2 mm×3 mm, the cutoff frequency would be (m=1, n=0, a=3) 50 GHz meaning energy at frequencies less than 50 GHz cannot propagate. For a thermal interface material, $\mu$ and $\varepsilon$ are greater than 1 so the cutoff frequency will be reduced proportionally.

In exemplary embodiments, the electrically-conductive material is parallel to direction of heat flow (e.g., upwards in FIG. 5, etc.) from the heat source to the heat removal/dissipation structure. The TIM with the electrically-conductive material creates a waveguide, which is too small to allow EMI energy below a given frequency to flow (waveguide below cutoff). The TIM with the electrically-conductive material does not operate by blocking energy, but instead operates by creating a path through which energy below a given frequency cannot flow.

In some exemplary embodiments, the top of the TIM (that will be in contact with or adjacent to the heat sink, chassis, etc.) may also be provided with electrically-conductive material as it would not affect electromagnetic performance, although this is not necessary for all exemplary embodiments. Preferably, the bottom of the TIM (that will be adjacent to or in contact with the heat source) is not electrically-conductive to avoid adversely affecting performance of the PCB.

In an exemplary embodiment, an electrically-conductive coating is applied to or provided along the outer side surfaces of the TIM. The electrically-conductive coating forces the waveguide created by the TIM into a particular size with well-defined boundary conditions, such that the waves below the cutoff frequency will not propagate through the TIM. By way of example, the electrically-conductive coating may comprise a metal coating, an electrically-conductive ink, etc. The electrically-conductive coating may be applied by dipping or immersing the TIM's outer side surfaces in the coating or by spraying the coating onto the TIM's outer side surfaces. Alternatively, the coating may be applied by any other suitable methods, such as by a printing process, a print nozzle, spray coating, ink jet process, brushing, screen printing, pad printing, stencil printing, roller coating, etc. In this example, the electrically-conductive coating will not directly contact the heat source (e.g., chip or other board-mounted component on the PCB, etc.) or the heat removal/dissipation structure or component (e.g., heat sink, etc.) when the BLS including the TIM is installed or mounted to the PCB. This is because the electrically-conductive coating is provided along only the TIM's outer side surfaces, which do not come into direct contact with the heat source or heat removal/dissipation structure when the BLS is mounted to the PCB. Instead, the TIM's top and bottom surfaces will respectively contact the heat removal/dissipation structure and the heat source when the BLS is installed or mounted to the PCB (e.g., FIG. 5, etc.). In this example, the electrically-conductive coating is not applied to the TIM's top and bottom surfaces. Alternatively, the TIM's top surface may also include the electrically-conductive coating. But the bottom surface of the TIM is preferably not electrically-conductive to avoid the TIM shorting out the heat source or otherwise adversely affecting performance of the PCB when the TIM is positioned in contact or adjacent with the heat source.

In another exemplary embodiment, an electrically-conductive fabric is wrapped about the outer surfaces of the sides of the TIM. The electrically-conductive fabric forces the waveguide created by the TIM into a particular size with well-defined boundary conditions, such that the waves below the cutoff frequency will not propagate through the TIM. By way of example, the electrically-conductive fabric may be wrapped about 80% to 90% of the TIM's perimeter defined by the TIM's outer side surfaces. Or, for example, the electrically-conductive fabric may be wrapped about the entire TIM perimeter (100%), i.e., all the way around the sides of the TIM. Also, by way of example, the electrically-conductive fabric may comprise an electrically-conductive polyester taffeta fabric that is attached to the TIM with an adhesive, etc. In this example, the electrically-conductive fabric will not directly contact the heat source (e.g., chip or other board-mounted component on the PCB, etc.) or the heat removal/dissipation structure or component (e.g., heat sink, etc.) when the BLS including the TIM is installed or mounted to the PCB. This is because the electrically-conductive fabric is provided along only the TIM's outer side surfaces, which do not come into direct contact with the heat source or heat removal/dissipation structure when the BLS is mounted to the PCB. Instead, the TIM's top and bottom surfaces will respectively contact the heat removal/dissipation structure and the heat source when the BLS is installed or mounted to the PCB (e.g., FIG. 5, etc.). In this example, the electrically-conductive fabric is not applied to the TIM's top and bottom surfaces. Alternatively, the TIM's top surface may also include the electrically-conductive material thereon. But the bottom surface of the TIM is preferably not electrically conductive to avoid the TIM shorting out the heat source or otherwise adversely affecting performance of the PCB when the TIM is positioned in contact or adjacent with the heat source.

In a further exemplary embodiment, electrically-conductive material may be internal or disposed within the TIM. By way of example, the electrically-conductive material comprises one or more electrically-conductive elements disposed internally along and adjacent the outer surfaces of the sides of the TIM. By way of example, the one or more electrically-conductive elements may comprise electrically-conductive filler (e.g., copper, silver, nickel, graphite, etc.). The internal electrically-conductive elements force the waveguide created by the TIM into a particular size with well-defined boundary conditions, such that the waves below the cutoff frequency will not propagate through the TIM. The electrically-conductive elements internal to the TIM are operable to block the EMI energy from escaping or leaking out through the opening in the BLS in which the TIM is positioned. The electrically-conductive elements are also oriented so that they will be parallel with the direction of heat flow (e.g., upwards in FIG. 5, etc.) from the heat source to the heat removal/dissipation structure.

Figure 3:
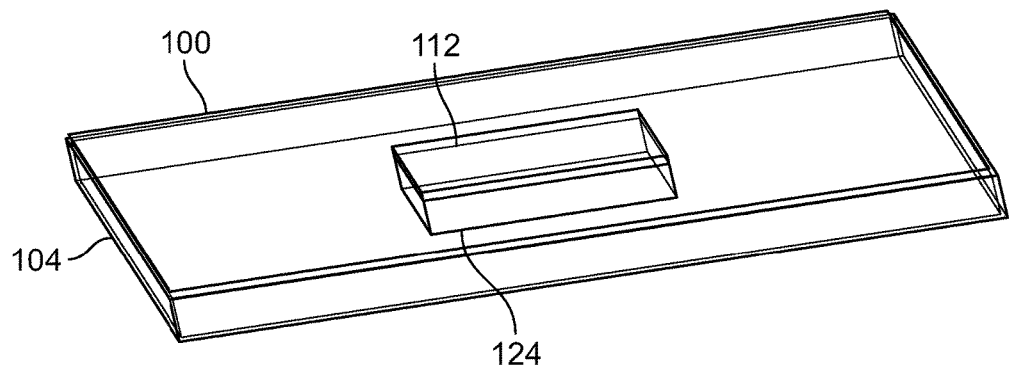
FIG. 3 is a perspective view of the BLS and TIM shown in FIG. 2, wherein the outer surfaces of the sides or edges of the TIM have been enclosed or provided with electrically-conductive material (e.g., electrically-conductive coating, etc.) according to an exemplary embodiment.
Figure 5:
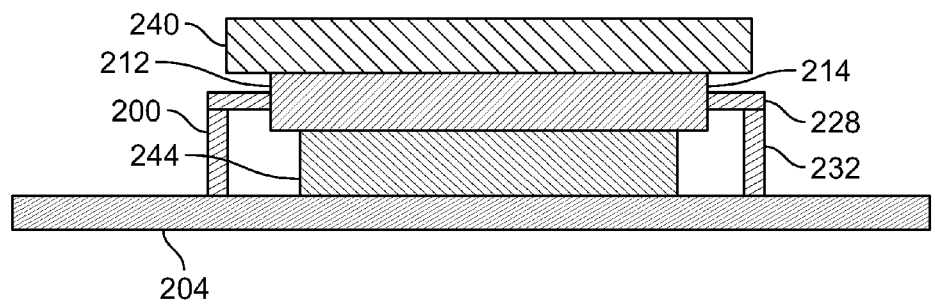
FIG. 5 is a cross-sectional side view illustrating a BLS including the TIM shown in FIG. 4, where the BLS is mounted to a PCB over a chip (broadly, a heat source) such that the TIM is in direct contact with the chip and a heat sink (broadly, a heat removal/dissipation structure or component) according to an exemplary embodiment.
Figure 6:
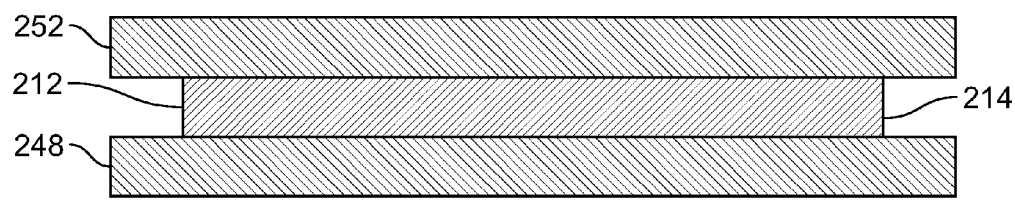
FIG. 6 is a cross-sectional side view illustrating the TIM shown in FIG. 4 between two electrical conductors according to an exemplary embodiment.
Figure 7:
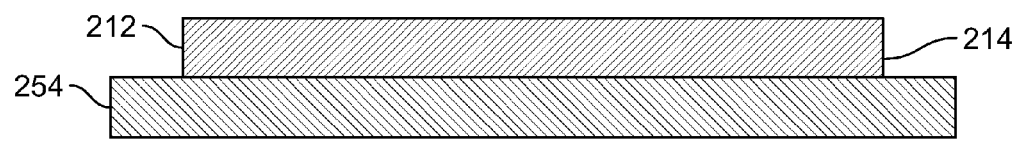
FIG. 7 is a cross-sectional side view illustrating the TIM shown in FIG. 4 being used as a shunt with connection to one conductor (ground) according to an exemplary embodiment.

Exemplary embodiments disclosed herein of TIMs (e.g., thermal pad, etc.) with electrically-conductive material (e.g., electrically-conductive fabric or film, electrically-conductive coating, etc.) may be used in various ways. For example, an exemplary embodiment of TIM with electrically-conductive material may be used with a board level shield, such as shown in FIGS. 3 and 5. Or, for example, an exemplary embodiment of TIM with electrically-conductive material may be used between two conductors, such as shown in FIG. 6. As a further example, an exemplary embodiment of TIM with electrically-conductive material may be used as a shunt with connection to one conductor (ground), such as shown in FIG. 7.

Figure 2:
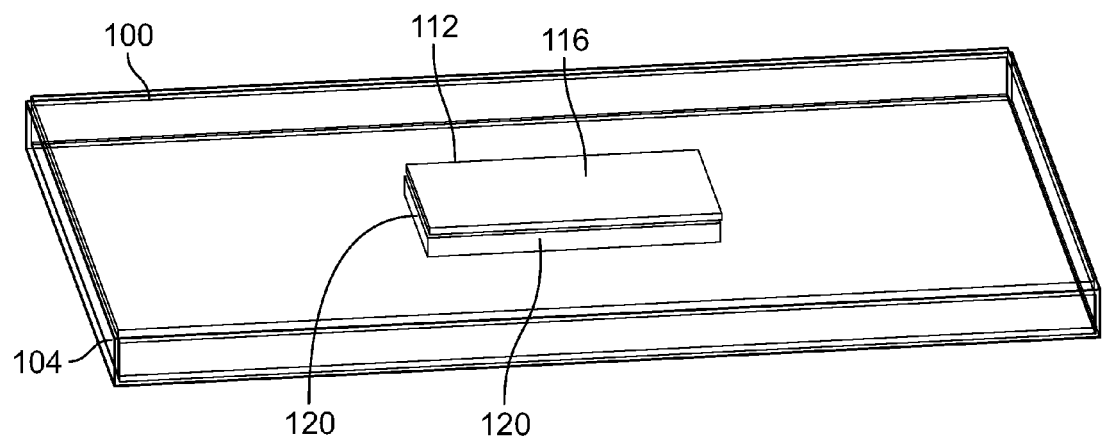

With reference now to the figures, FIG. 1 illustrates a board level shield (BLS) 100 mounted on a printed circuit board (PCB) 104. The top of the BLS 100 includes an opening 108. As shown in FIG. 2, a thermal interface material (TIM) 112 may be inserted into the opening 108 in the top of the BLS 100. Alternatively, the TIM 112 may be used with (e.g., as a lid or cover for, etc.) a BLS fence or frame that defines the opening.

The TIM 112 includes a top surface or face 116, a bottom surface or face (not shown in FIG. 2), and four sides 120. As shown in FIG. 3, the outer surfaces of the sides 116 of the TIM 112 have been enclosed or provided with electrically-conductive material 124 (e.g., electrically-conductive coating, etc.) in this exemplary embodiment. As disclosed herein, the electrically-conductive material 124 forces the waveguide created by the TIM 112 into a particular size with well-defined boundary conditions, such that the waves below the cutoff frequency will not propagate through the TIM 112. The ruler in FIGS. 1-3 and dimensions in millimeters gleaned therefrom are provided for purposes of illustration only as the BLS, TIM, PCB, etc. may be larger and smaller than what is shown in the figures.

By way of example, the electrically-conductive material 124 may comprise an electrically-conductive coating, such as a metal coating, an electrically-conductive ink, etc. The electrically-conductive coating may be applied or provided using various methods, such as by spraying the electrically-coating onto the TIM 112, by dipping the TIM 112 in an electrically-conductive solution, etc. Alternatively, the electrically-conductive material 124 may comprise an electrically-conductive fabric (e.g., an electrically-conductive polyester taffeta fabric, metal-plated cloth, electrically-conductive ripstop fabric, etc.) or an electrically-conductive film (e.g., tin/copper-plated film, a plated polyimide (PI) film, etc.). An acrylic-based electrically-conductive adhesive or other suitable adhesive may be used to attach the electrically-conductive fabric or film to the TIM.

Figure 4:
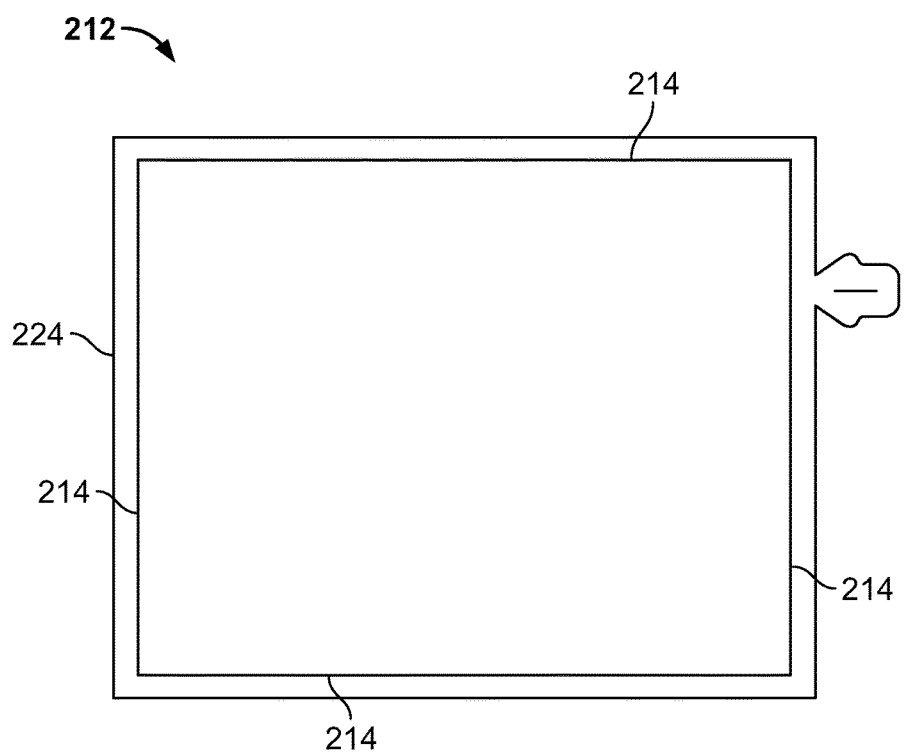
FIG. 4 is a top view of a TIM having an electrically-conductive fabric wrapped about the outer surfaces of the sides of the TIM according to an exemplary embodiment.

FIG. 4 illustrates an exemplary embodiment of a TIM 212 having electrically-conductive fabric 224 wrapped about the outer surfaces of the four sides or edges 214 of the TIM 212. The electrically-conductive fabric 224 forces the waveguide created by the TIM 212 into a particular size with well-defined boundary conditions, such that the waves below the cutoff frequency will not propagate through the TIM 212.

By way of example, the electrically-conductive fabric 224 may comprise an electrically-conductive polyester taffeta fabric having a thickness of 0.1 millimeters and that was plated with nickel and copper. As another example, the electrically-conductive fabric 224 may comprise Laird's Flectron™ metallized fabric that is a nickel and copper plated fabric in which nickel is plated over a base layer of copper previously plated on the fabric. An acrylic electrically-conductive adhesive or other suitable adhesive may be used to attach the electrically-conductive fabric to the TIM.

As shown in FIG. 5, the TIM 212 may be used with a board level shield (BLS) 200. The BLS 200 includes a top or cover 228 and sidewalls 232 depending from the top 228. The sidewalls 232 are configured for installation (e.g., soldering, etc.) to the printed circuit board (PCB) 204 (broadly, a substrate) generally about one or more components (e.g., chip 244, etc.) on the PCB 204. The top 228 includes an opening in which the TIM 212 is positioned. Alternatively, the TIM 212 may be used with (e.g., as a lid or cover for, etc.) a BLS fence or frame that defines the opening.

FIG. 5 shows the BLS 200 mounted to the PCB 204 over the chip 244 (broadly, a heat source) such that the TIM 212 is in direct contact with the chip 244 and a heat sink 240 (broadly, a heat removal/dissipation structure or component). In this example, the TIM 212 defines a thermally-conductive heat path having a direction of heat flow (up in FIG. 5) from the chip 244 to the heat sink 240. The four sides or edges 214 of the TIM 212 and electrically-conductive fabric 224 (FIG. 4) wrapped therearound are generally parallel with the direction of heat flow. The BLS 200 and TIM 212 are operable for providing electromagnetic interference (EMI) shielding for the chip 244, with the TIM 212 operating as a waveguide that prevents energy below a cutoff frequency from flowing through the TIM 212.

Although FIG. 5 shows the TIM 212 positioned between the chip 244 and the heat sink 240, example embodiments of the thermal interface materials and board level shields disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermal interface material or otherwise provides or transfers heat to the thermal interface material regardless of whether the heat is generated by the heat source or merely transferred through or via the heat source. Accordingly, aspects of the present disclosure should not be limited to any particular use with any single type of heat source, electronic device, heat removal/dissipation structure, etc.

As shown in FIG. 6, the TIM 212 with the electrically-conductive fabric 224 (FIG. 4) may also be used between two electrical conductors 248, 252 according to an exemplary embodiment. In this example shown in FIG. 6, the TIM 212 operates as a waveguide that prevents energy below a cutoff frequency from flowing through the TIM 212. For example, the TIM 212 may operate as a waveguide that prevents energy below a cutoff frequency from flowing (upward in FIG. 6) from the electrical conductor 248 through the TIM 212 to the electrical conductor 252. Additionally, or alternatively, the TIM 212 may operate as a waveguide that prevents energy below a cutoff frequency from flowing (downward in FIG. 6) from the electrical conductor 252 through the TIM 212 to the electrical conductor 248. The TIM 212 may provide an electrical connection and/or define a thermally-conductive heat path between the two electrical conductors 248, 252. In which case, the four sides or edges 214 of the TIM 212 and electrically-conductive fabric 224 (FIG. 4) wrapped therearound are generally parallel with the direction (e.g., up or down in FIG. 6) of heat flow and/or electric current flow between the two electrical conductors 248, 252.

As shown in FIG. 7, the TIM 212 with the electrically-conductive fabric 224 (FIG. 4) may also be used as a shunt with connection to one conductor (ground) 254 according to an exemplary embodiment. In this example shown in FIG. 7, the TIM 212 may operate as a waveguide that prevents energy below a cutoff frequency from flowing through the TIM 212. For example, the TIM 212 may operate as a waveguide that prevents energy below a cutoff frequency from flowing (upward in FIG. 7) from the electrical conductor or ground 254 through the TIM 212. Additionally, or alternatively, the TIM 212 may operate as a waveguide that prevents energy below a cutoff frequency from flowing (downward in FIG. 7) through the TIM 212 to the electrical conductor or ground 254.

Example methods are also disclosed herein. In a first example, a method generally includes providing electrically-conductive material along and/or adjacent to one or more outer side surfaces of a thermal interface material, such that the electrically-conductive material is generally parallel to the one or more outer side surfaces and generally perpendicular to top and/or bottom surfaces of the thermal interface material and/or such that the thermal interface material is configured to be operable as a waveguide through which energy below a cutoff frequency cannot flow. In a second example, a method generally includes positioning a thermal interface material within an opening in a top of a shield, wherein the thermal interface material includes a top surface, a bottom surface, one or more outer side surfaces extending between the top and bottom surfaces, and electrically-conductive material along and/or adjacent the one or more outer side surfaces. In a third example, a method generally includes positioning a thermal interface material over a heat source on a substrate such that a bottom surface of the thermal interface material is positioned against or adjacent the heat source and a top surface of the thermal interface material is positioned adjacent or against a heat removal/dissipation structure, wherein the thermal interface material includes one or more outer side surfaces extending between the top and bottom surfaces and electrically-conductive material along and/or adjacent the one or more outer side surfaces.

In the above example methods, the electrically-conductive material may comprise an electrically-conductive coating, and the method may comprise applying the electrically-conductive coating along the one or more outer side surfaces of the thermal interface material. Or, for example, the electrically-conductive material may comprise an electrically-conductive fabric or film, and the method may comprise wrapping the electrically-conductive fabric or film about less than or all of the entire perimeter defined by the one or more outer side surfaces of the thermal interface material. As a further example, the electrically-conductive material may comprise one or more electrically-conductive elements, and the method may comprise internally disposing the electrically-conductive elements within the thermal interface material along and/or adjacent the one or more outer side surfaces of the thermal interface material. The electrically-conductive material may force the waveguide created by the thermal interface material into a particular size with well-defined boundary conditions such that waves below a cutoff frequency are not unable to propagate through the thermal interface material.

A method may include positioning the thermal interface material relative to a heat source and a heat removal/dissipation structure such that the thermal interface material defines a thermally-conductive heat path having a direction of heat flow from the heat source to the heat removal/dissipation structure and such that the electrically-conductive material is parallel with the direction of heat flow. A method may include positioning a shield having the thermal interface material over a heat source on a printed circuit board such that the bottom surface of the thermal interface material is positioned against or adjacent the heat source, the top surface of the thermal interface material is positioned adjacent or against a heat removal/dissipation structure, the thermal interface material defines a thermally-conductive heat path having a direction of heat flow from the heat source to the heat removal/dissipation structure, the electrically-conductive material is parallel with the direction of heat flow, and the shield is operable for providing electromagnetic interference (EMI) shielding for the heat source on the printed circuit board with the thermal interface material operating as a waveguide that prevents energy below a cutoff frequency from flowing through the thermal interface material. The heat removal/dissipation structure may be a heat sink. The heat source may be a chip on a printed circuit board.

A wide range of thermal interface materials may be used in exemplary embodiments disclosed herein, such as thermal gap fillers, thermal phase change materials, thermally-conductive EMI absorbers or hybrid thermal/EMI absorbers, thermal greases, thermal pastes, thermal putties, dispensable thermal interface materials, thermal pads, etc. Example embodiments may include one or more thermal interface materials of Laird, such as any one or more of the Tflex™ series gap fillers (e.g., Tflex™ 300 series thermal gap filler materials, Tflex™ 600 series thermal gap filler materials, Tflex™ 700 series thermal gap filler materials, etc.), Tpcm™ series thermal phase change materials (e.g., Tpcm™ 580 series phase change materials, etc.), Tpli™ series gap fillers (e.g., Tpli™ 200 series gap fillers, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), etc.

By way of further example, a thermal interface material (TIM) may comprise an elastomer and/or ceramic particles, metal particles, ferrite EMI/RFI absorbing particles, metal or fiberglass meshes in a base of rubber, gel, or wax, etc. A TIM may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermally-conductive additives, etc. A TIM may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the TIM material to closely conform (e.g., in a relatively close fitting and encapsulating manner, etc.) to a mating surface when placed in contact with the mating surface, including a non-flat, curved, or uneven mating surface. For example, the TIM may have very high compliancy such that the TIM will relatively closely conform to the size and outer shape of an electrical component when the TIM is compressed against the electrical component when the shield is installed to a printed circuit board over the electrical component.

The TIM may comprise a soft thermal interface material formed from elastomer and at least one thermally-conductive metal, boron nitride, and/or ceramic filler, such that the soft thermal interface material is conformable even without undergoing a phase change or reflow. The TIM may be a non-metal, non-phase change material that does not include metal and that is conformable even without undergoing a phase change or reflow. A TIM may comprise a thermal interface phase change material.

The TIM may be a non-phase change material and/or be configured to adjust for tolerance or gap by deflecting. In some exemplary embodiments, the TIM may comprise a non-phase change gap filler or gap pad that is conformable without having to melt or undergo a phase change. The TIM may be able to adjust for tolerance or gaps by deflecting at low temperatures (e.g., room temperature of 20° C. to 25° C., etc.). The TIM may have a Young's modulus and Hardness Shore value considerably lower than copper or aluminum. The TIM may also have greater percent deflection versus pressure than copper or aluminum.

In some exemplary embodiments, the TIM comprises Tflex™ 300 ceramic filled silicone elastomer gap filler or Tflex™ 600 boron nitride filled silicone elastomer gap filler. Tflex™ 300 ceramic filled silicone elastomer gap filler and Tflex™ 600 boron nitride filled silicone elastomer gap filler have a Shore 00 hardness value (per the ASTM D2240 test method) of about 27 and 25, respectively. In some other exemplary embodiments, the TIM may comprise Tpli™ 200 boron nitride filled, silicone elastomer, fiberglass reinforced gap filler having a Shore 00 hardness of about 70 or 75. Accordingly, exemplary embodiments may include TIMs having Shore 00 hardness less than 100. Tflex™ 300 series thermal gap filler materials generally include, e.g., ceramic filled silicone elastomer which will deflect to over 50% at pressures of 50 pounds per square inch. Tflex™ 600 series thermal gap filler materials generally include boron nitride filled silicone elastomer, and have a hardness of 25 Shore 00 or 40 Shore 00 per ASTM D2240. Tpli™ 200 series gap fillers generally include reinforced boron nitride filled silicone elastomer and have a hardness of 75 Shore 00 or 70 Shore 00 per ASTM D2240. Tpcm™ 580 series phase change materials are generally non-reinforced films having a phase change softening temperature of about 122 degrees Fahrenheit (50 degrees Celsius). Other exemplary embodiments may include a TIM with a hardness of less than 25 Shore 00, greater than 75 Shore 00, between 25 and 75 Shore 00, etc.

Exemplary embodiments may include a TIM having a high thermal conductivity (e.g., 1 W/mK (watts per meter per Kelvin), 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, etc.) depending on the particular materials used to make the TIM and loading percentage of the thermally conductive filler, if any. These thermal conductivities are only examples as other embodiments may include a TIM with a thermal conductivity higher than 6 W/mK, less than 1 W/mK, or other values between 1 and 6 W/mk. Accordingly, aspects of the present disclosure should not be limited to use with any particular TIM as exemplary embodiments may include a wide range of thermal interface materials.

In exemplary embodiments, the TIM may be used to define or provide part of a thermally-conductive heat path from a heat source to a heat removal/dissipation structure or component. A TIM disclosed herein may be used, for example, to help conduct thermal energy (e.g., heat, etc.) away from a heat source of an electronic device (e.g., one or more heat generating components, central processing unit (CPU), die, semiconductor device, etc.). A TIM may be positioned generally between a heat source and a heat removal/dissipation structure or component (e.g., a heat spreader, a heat sink, a heat pipe, a device exterior case or housing, chassis, etc.) to establish a thermal joint, interface, pathway, or thermally-conductive heat path along which heat may be transferred (e.g., conducted) from the heat source to the heat removal/dissipation structure or component. During operation, the TIM may then function to allow transfer (e.g., to conduct heat, etc.) of heat from the heat source along the thermally-conductive path to the heat removal/dissipation structure or component.

A wide range of materials may be used in exemplary embodiments for the BLS. By way of example, a non-exhaustive list of exemplary materials from which the BLS may be made include cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein are for purposes of illustration only, as different materials may be used depending, for example, on the particular application, such as the components to be shielded, space considerations within the overall device, EMI shielding and heat dissipation needs, and other factors.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "have," "has," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed:

1. A thermal interface material comprising:
   a top surface;
   a bottom surface;
   one or more outer side surfaces extending between the top and bottom surfaces; and
   electrically-conductive material along the one or more outer side surfaces;
   whereby the thermal interface material, via the electrically-conductive material, is configured to be operable as a waveguide through which energy below a cutoff frequency cannot flow; and
   whereby the electrically-conductive material will be parallel with a direction of heat flow from a heat source to a heat removal/dissipation structure when the bottom surface is positioned against or adjacent the heat source and the top surface is positioned adjacent or against the heat removal/dissipation structure.

2. The thermal interface material of claim 1, wherein:
   the electrically-conductive material comprises an electrically-conductive coating along only the one or more outer side surfaces of the thermal interface material, which do not come into direct contact with the heat source when the bottom surface is positioned against the heat source; and/or
   the electrically-conductive material comprises an electrically-conductive fabric or film wrapped only about the one or more outer side surfaces of the thermal interface material, which do not come into direct contact with the heat source when the bottom surface is positioned against the heat source.

3. The thermal interface material of claim 1, wherein the electrically-conductive material comprises an electrically-conductive fabric or film wrapped about less than or all of an entire perimeter defined by the one or more outer side surfaces of the thermal interface material, and wherein the electrically-conductive fabric or film covers the one or more outer side surfaces of the thermal interface material.

4. The thermal interface material of claim 1, wherein the electrically-conductive material comprises one or more internal electrically-conductive elements disposed within the thermal interface material internally along and oriented parallel with the one or more outer side surfaces of the thermal interface material.

5. The thermal interface material of claim 1, wherein the electrically-conductive material encloses and/or covers the one or more outer side surfaces, whereby the electrically-conductive material is configured to force the waveguide created by the thermal interface material, and the electrically-conductive material, into a particular size with well-defined boundary conditions such that waves below a cutoff frequency are unable to propagate through the thermal interface material.

6. The thermal interface material of claim 1, wherein:
the thermal interface material is positioned between two electrical conductors; or
the thermal interface material is operable as a shunt with connection to an electrical conductor or ground.

7. A board level shield comprising the thermal interface material of claim 1 positioned within an opening in a top of the board level shield, whereby the electrically-conductive material is configured to be operable to help contain electromagnetic interference that might otherwise be emitted or escape from under the board level shield via the thermal interface material, and whereby the thermal interface material with the electrically-conductive material are configured to be operable for creating a path through which energy is flowable except for the energy below the cutoff frequency.

8. An electronic device comprising:
a printed circuit board having a heat source thereon;
the board level shield of claim 7 mounted to the printed circuit board over the heat source; and
a heat removal/dissipation structure;
wherein:
the bottom surface of the thermal interface material is positioned against or adjacent the heat source;
the top surface of the thermal interface material is positioned adjacent or against the heat removal/dissipation structure;
the thermal interface material defines a thermally-conductive heat path having a direction of heat flow from the heat source to the heat removal/dissipation structure;
the electrically-conductive material is parallel with the direction of heat flow; and
the board level shield and the thermal interface material are operable for providing electromagnetic interference (EMI) shielding for the heat source on the printed circuit board with the thermal interface material, and the electrically-conductive material along the one or more outer side surfaces of the thermal interface material, operating as a waveguide that prevents energy below a cutoff frequency from flowing through the thermal interface material.

9. The electronic device of claim 8, wherein:
the heat removal/dissipation structure is a heat sink; and/or
the heat source is a chip on the printed circuit board.

10. A shield comprising:
a top having an opening therein;
one or more sidewalls depending from the top and configured for installation to a substrate generally about one or more components on the substrate; and
a thermal interface material positioned within the opening, the thermal interface material including a top surface, a bottom surface, one or more outer side surfaces extending between the top and bottom surfaces, and electrically-conductive material along the one or more outer side surfaces such that the electrically-conductive material is generally parallel to the one or more outer side surfaces and generally perpendicular to the top and/or bottom surfaces, whereby the electrically-conductive material is operable to help contain electromagnetic interference that might otherwise be emitted or escape from under the shield via the thermal interface material, and whereby the thermal interface material with the electrically-conductive material are configured to be operable for creating a path through which energy is flowable except for energy below a cutoff frequency.

11. The shield of claim 10, wherein:
the shield is operable for providing electromagnetic interference (EMI) shielding for the one or more components on the substrate that are within an interior defined by the top, the one or more sidewalls, and the thermal interface material; and
the thermal interface material, with the electrically-conductive material along the one or more outer side surfaces thereof, is operable as a waveguide that prevents energy below a cutoff frequency from flowing through the thermal interface material.

12. The shield of claim 10, wherein:
the electrically-conductive material comprises an electrically-conductive coating along only the one or more outer side surfaces of the thermal interface material; and/or
the electrically-conductive material comprises an electrically-conductive fabric or film wrapped only about the one or more outer side surfaces of the thermal interface material.

13. The shield of claim 10, wherein the electrically-conductive material comprises an electrically-conductive fabric or film wrapped about less than or all of an entire perimeter defined by the one or more outer side surfaces of the thermal interface material, and wherein the electrically-conductive fabric or film is provided along only the one or more outer side surfaces of the thermal interface material.

14. The shield of claim 10, wherein the electrically-conductive material comprises one or more internal electrically-conductive elements disposed within the thermal interface material internally along and oriented parallel with the one or more outer side surfaces of the thermal interface material.

15. An electronic device comprising:
a printed circuit board having a heat source thereon;
the shield of claim 10 mounted to the printed circuit board over the heat source; and
a heat removal/dissipation structure;
wherein:
the bottom surface of the thermal interface material is positioned against or adjacent the heat source;

the top surface of the thermal interface material is positioned adjacent or against the heat removal/dissipation structure;

the thermal interface material defines a thermally-conductive heat path having a direction of heat flow from the heat source to the heat removal/dissipation structure;

the electrically-conductive material is parallel with the direction of heat flow; and the shield is operable for providing electromagnetic interference (EMI) shielding for the heat source on the printed circuit board with the thermal interface material, and the electrically-conductive material along the one or more outer side surfaces of the thermal interface material, operating as a waveguide that prevents energy below a cutoff frequency from flowing through the thermal interface material.

16. The electronic device of claim 15, wherein:

the heat removal/dissipation structure is a heat sink; and/or the heat source is a chip on the printed circuit board.

17. A method comprising:

providing electrically-conductive material along to one or more outer side surfaces of a thermal interface material, such that the electrically-conductive material is generally parallel to the one or more outer side surfaces and generally perpendicular to top and/or bottom surfaces of the thermal interface material and such that the electrically-conductive material thereby configures the thermal interface material to be operable as a waveguide through which energy below a cutoff frequency cannot flow; or positioning a thermal interface material within an opening in a top of a shield, wherein the thermal interface material includes a top surface, a bottom surface, one or more outer side surfaces extending between the top and bottom surfaces, and electrically-conductive material along the one or more outer side surfaces, whereby the thermal interface material, via the electrically-conductive material, is configured to be operable as a waveguide through which energy below a cutoff frequency cannot flow; or positioning a thermal interface material over a heat source on a substrate such that a bottom surface of the thermal interface material is positioned against or adjacent the heat source and a top surface of the thermal interface material is positioned adjacent or against a heat removal/dissipation structure, wherein the thermal interface material includes one or more outer side surfaces extending between the top and bottom surfaces and electrically-conductive material along the one or more outer side surfaces, whereby the thermal interface material, via the electrically-conductive material, is configured to be operable as a waveguide through which energy below a cutoff frequency cannot flow.

18. The method of claim 17, wherein the method includes:

positioning the thermal interface material between two electrical conductors; or using the thermal interface material as a shunt with connection to an electrical conductor or ground.

19. The method of claim 17, wherein:

the electrically-conductive material comprises an electrically-conductive coating, and the method comprises applying the electrically-conductive coating along and directly to only the one or more outer side surfaces of the thermal interface material; or the electrically-conductive material comprises an electrically-conductive fabric or film, and the method comprises wrapping the electrically-conductive fabric or film about less than or all of the entire perimeter defined by the one or more outer side surfaces of the thermal interface material such that the electrically-conductive fabric or film covers and/or encloses only the one or more outer side surfaces of the thermal interface material; or the electrically-conductive material comprises one or more electrically-conductive elements, and the method comprising internally disposing the electrically-conductive elements within the thermal interface material internally along and oriented parallel with the one or more outer side surfaces of the thermal interface material.

20. The method of claim 17, wherein:

the electrically-conductive material is along only the one or more outer side surfaces of the thermal interface material such that the electrically-conductive material is configured to force the waveguide created by the thermal interface material and the electrically-conductive material into a particular size with well-defined boundary conditions such that waves below a cutoff frequency are unable to propagate through the thermal interface material.

* * * * *